US009822466B2

(12) United States Patent
Swaminathan et al.

(10) Patent No.: US 9,822,466 B2
(45) Date of Patent: *Nov. 21, 2017

(54) CRYSTAL GROWING SYSTEMS AND CRUCIBLES FOR ENHANCING HEAT TRANSFER TO A MELT

(71) Applicant: SunEdison, Inc., St. Peters, MO (US)

(72) Inventors: Tirumani N. Swaminathan, Creve Coeur, MO (US); John David Hilker, St. Charles, MO (US); Salvador Zepeda, St. Peters, MO (US)

(73) Assignee: Corner Star Limited, Kowloon (HK)

( * ) Notice: Subject to any disclaimer, the term of this patent is extended or adjusted under 35 U.S.C. 154(b) by 94 days.

This patent is subject to a terminal disclaimer.

(21) Appl. No.: 14/087,604

(22) Filed: Nov. 22, 2013

(65) Prior Publication Data

US 2015/0144056 A1     May 28, 2015

(51) Int. Cl.
| | |
|---|---|
| *C30B 15/12* | (2006.01) |
| *C30B 15/00* | (2006.01) |
| *C30B 29/06* | (2006.01) |
| *C30B 11/00* | (2006.01) |

(52) U.S. Cl.
CPC ............ *C30B 15/12* (2013.01); *C30B 15/002* (2013.01); *C30B 29/06* (2013.01); *C30B 11/002* (2013.01); *Y10T 117/1052* (2015.01)

(58) Field of Classification Search
CPC ..... C30B 15/12; C30B 15/002; C30B 11/002; C30B 15/10; Y10T 117/1052
USPC ................ 117/200, 206, 213, 18, 30, 31, 33
See application file for complete search history.

(56) References Cited

U.S. PATENT DOCUMENTS

| | | | |
|---|---|---|---|
| 2,892,739 A | * | 6/1959 | Rusler .................... C30B 15/02 |
| | | | 117/19 |
| 4,456,499 A | | 6/1984 | Lin |
| 5,021,225 A | | 6/1991 | Yamashita et al. |
| 5,073,229 A | | 12/1991 | Yamashita et al. |
| 5,256,381 A | * | 10/1993 | Tada ....................... C30B 27/02 |
| | | | 117/213 |

(Continued)

FOREIGN PATENT DOCUMENTS

| | | | | |
|---|---|---|---|---|
| CN | 202380124 U | | 8/2012 | |
| JP | 01317189 A | * | 12/1989 | ............. C30B 15/12 |

(Continued)

OTHER PUBLICATIONS

Japan Platform for Patent Information, English Computer translation of JP 05-310495 A (2015).*

(Continued)

*Primary Examiner* — Matthew Song
(74) *Attorney, Agent, or Firm* — Armstrong Teasdale LLP

(57) ABSTRACT

A system for growing an ingot from a melt includes an outer crucible, an inner crucible, and a weir. The outer crucible includes a first sidewall and a first base. The first sidewall and the first base define an outer cavity for containing the melt. The inner crucible is located within the outer cavity, and has a central longitudinal axis. The inner crucible includes a second sidewall and a second base having an opening therein. The opening in the second base is concentric with the central longitudinal axis. The weir is disposed between the outer crucible and the inner crucible for supporting the inner crucible.

20 Claims, 8 Drawing Sheets

(56) References Cited

U.S. PATENT DOCUMENTS

| | | | | |
|---|---|---|---|---|
| 5,279,798 | A * | 1/1994 | Keneto | C30B 15/12 |
| | | | | 117/213 |
| 5,871,581 | A * | 2/1999 | Atami | C30B 15/02 |
| | | | | 117/200 |
| 6,447,602 | B1 | 9/2002 | Beswick | |
| 7,229,494 | B2 | 6/2007 | Asahi et al. | |
| 8,262,797 | B1 * | 9/2012 | Bender | C30B 29/06 |
| | | | | 117/217 |
| 8,317,919 | B2 | 11/2012 | Bender | |
| 2012/0301386 | A1 | 11/2012 | Johnson et al. | |
| 2014/0144371 | A1 * | 5/2014 | Swaminathan | C30B 15/14 |
| | | | | 117/13 |
| 2014/0174337 | A1 * | 6/2014 | Swaminathan | C30B 15/002 |
| | | | | 117/14 |
| 2014/0261154 | A1 * | 9/2014 | Swaminathan | C30B 15/12 |
| | | | | 117/31 |
| 2014/0261155 | A1 * | 9/2014 | Kimbel | C30B 15/12 |
| | | | | 117/31 |

FOREIGN PATENT DOCUMENTS

| | | | | | |
|---|---|---|---|---|---|
| JP | 03199192 | A * | 8/1991 | | C30B 15/12 |
| JP | 05310495 | A * | 11/1993 | | C30B 15/02 |
| JP | 2007331998 | A | 12/2007 | | |
| RU | 904347 | C | 4/1993 | | |

OTHER PUBLICATIONS

International Search Report and Written Opinion of the International Searching Authority regarding PCT/US2014/066681 dated Mar. 30, 2015; 13 pgs.

* cited by examiner

CRYSTAL GROWING SYSTEMS AND CRUCIBLES FOR ENHANCING HEAT TRANSFER TO A MELT

FIELD

The field of the disclosure relates generally to systems for producing ingots of semiconductor or solar material from a melt and, more particularly, to systems for reducing dislocations and impurity concentrations in the ingot, and enhancing heat transfer within the melt.

BACKGROUND

In the production of single silicon crystals grown by the Czochralski (CZ) method, polycrystalline silicon is first melted within a crucible, such as a quartz crucible, of a crystal pulling device to form a silicon melt. The puller then lowers a seed crystal into the melt and slowly raises the seed crystal out of the melt. To produce a single, high quality crystal using this method, the temperature and the stability of the surface of the melt immediately adjacent to the ingot must be maintained substantially constant. Further, the melt temperature adjacent to the ingot must be maintained at a sufficiently high temperature to prevent the melt from prematurely solidifying. Prior systems for accomplishing this goal have not been completely satisfactory. Thus, there exists a need for a system that not only limits temperature fluctuations and surface disruptions in the melt immediately adjacent to the ingot, but also provides sufficient heat transfer to the melt adjacent to the ingot for maintaining the temperature of the melt.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

A first aspect of the present disclosure is a system for growing an ingot from a melt. The system includes an outer crucible, an inner crucible, and a weir. The outer crucible includes a first sidewall and a first base. The first sidewall and the first base define an outer cavity for containing the melt. The inner crucible is located within the outer cavity, and has a central longitudinal axis. The inner crucible includes a second sidewall and a second base having an opening therein. The opening in the second base is concentric with the central longitudinal axis. The weir is disposed between the outer crucible and the inner crucible for supporting the inner crucible.

Another aspect of the present disclosure is a system for growing an ingot from a melt. The system includes an outer crucible, an inner crucible, and a weir. The outer crucible includes a first sidewall and a first base. The first sidewall and the first base define an outer cavity for containing the melt. The inner crucible is located within the outer cavity, and includes a second sidewall and a second base having an opening therein. The opening has a first cross-sectional area. The weir is disposed between the outer crucible and the inner crucible for supporting the inner crucible. The weir has a second cross-sectional area. The ratio between the first cross-sectional area and the second cross-sectional is at least about 0.25.

Another aspect of the present disclosure is a system for growing an ingot from a melt. The system includes an outer crucible, an inner crucible, a first weir, and a second weir. The outer crucible includes a first sidewall and a first base. The first sidewall and the first base define an outer cavity for containing the melt. The inner crucible is located within the outer cavity, and includes a second sidewall and a second base having an opening therein. The second sidewall and the second base define an inner cavity. The opening is sized to facilitate the transfer of heat between the outer cavity and the inner cavity. The first weir is disposed between the outer crucible and the inner crucible. The second weir is positioned radially outward from the first weir for separating the melt into multiple melt zones.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

In a crystal growing system using a continuous Czochralski process, one or more silica weirs are located between an outer or first crucible and an inner or second crucible to form a crucible assembly. The second crucible may be supported by the one or more weir(s) that are submerged within the melt. These weir(s) create multiple zones within the crucible assembly to limit the melt within one zone from passing into another zone to specific locations. One example of such a crystal growing system is disclosed in U.S. patent application Ser. No. 13/804,585 (the "'585 application") filed Mar. 14, 2013, the entirety of which is hereby incorporated by reference.

Figure 1:
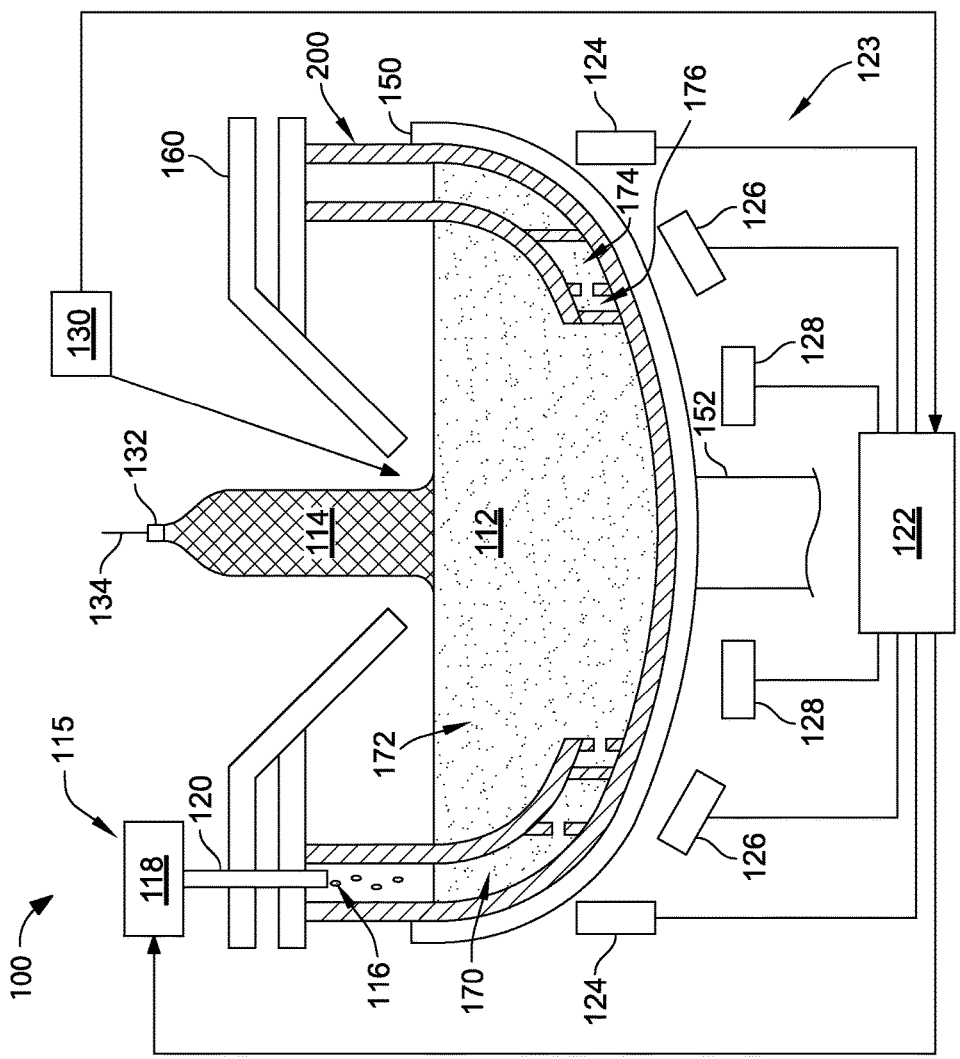
FIG. 1 is cross-section of a crystal growing system including a crucible assembly.

Referring to FIG. 1, a crystal growing system is shown schematically and is indicated generally at 100. The crystal growing system 100 is used to produce a single crystal ingot by a Czochralski method. As discussed herein, the system is described in relation to the continuous Czochralski method of producing single crystal ingots, though a batch process may be used. For example, the process may be used in a "recharge" CZ process.

The crystal growing system 100 includes a susceptor 150 supported by a rotatable shaft 152, and a crucible assembly 200 that contains a silicon melt 112 from which an ingot 114 is being pulled by a puller 134. During the crystal pulling process, a seed crystal 132 is lowered by the puller 134 into the melt 112 and then slowly raised from the melt 112. As the seed crystal 132 is slowly raised from the melt 112, silicon atoms from the melt 112 align themselves with and attach to the seed crystal 132 to form the ingot 114.

The system 100 also includes a feed system 115 for feeding solid feedstock material 116 into the crucible assembly 200 and/or the melt 112, a heat reflector 160, and a heat system 123 for providing heat to the crucible assembly 200 and maintaining the melt 112.

Figure 2:
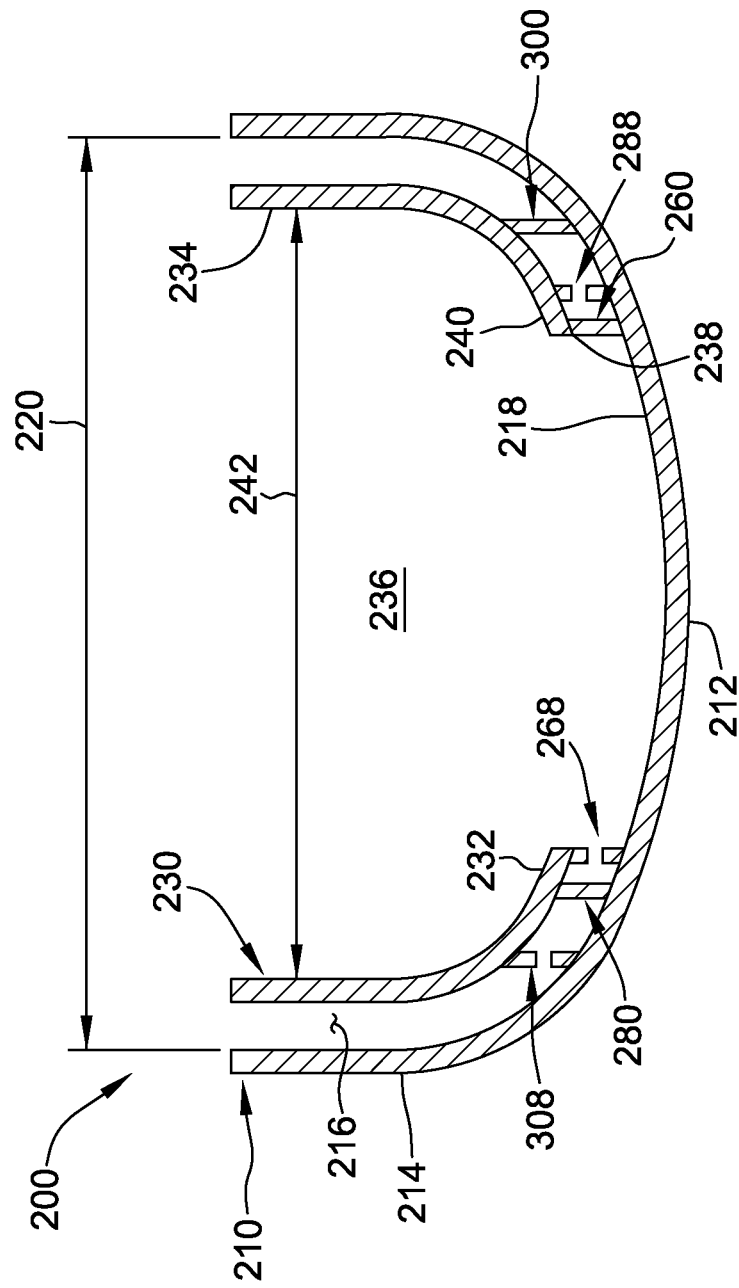
FIG. 2 is an enlarged cross-section of the crucible assembly of FIG. 1.
Figure 3:
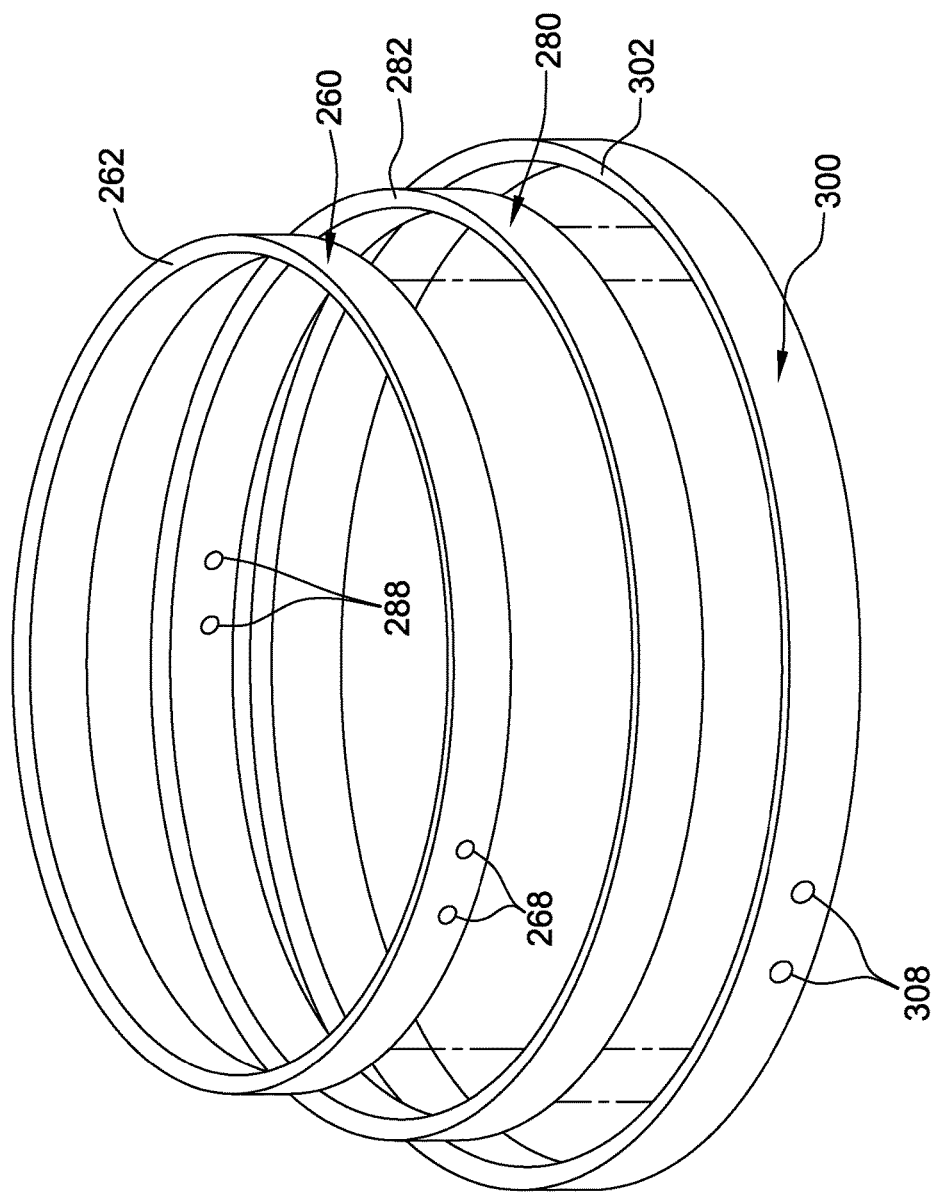
FIG. 3 is an exploded view of a plurality of weirs used in the crucible assembly of FIG. 2.
Figure 4:
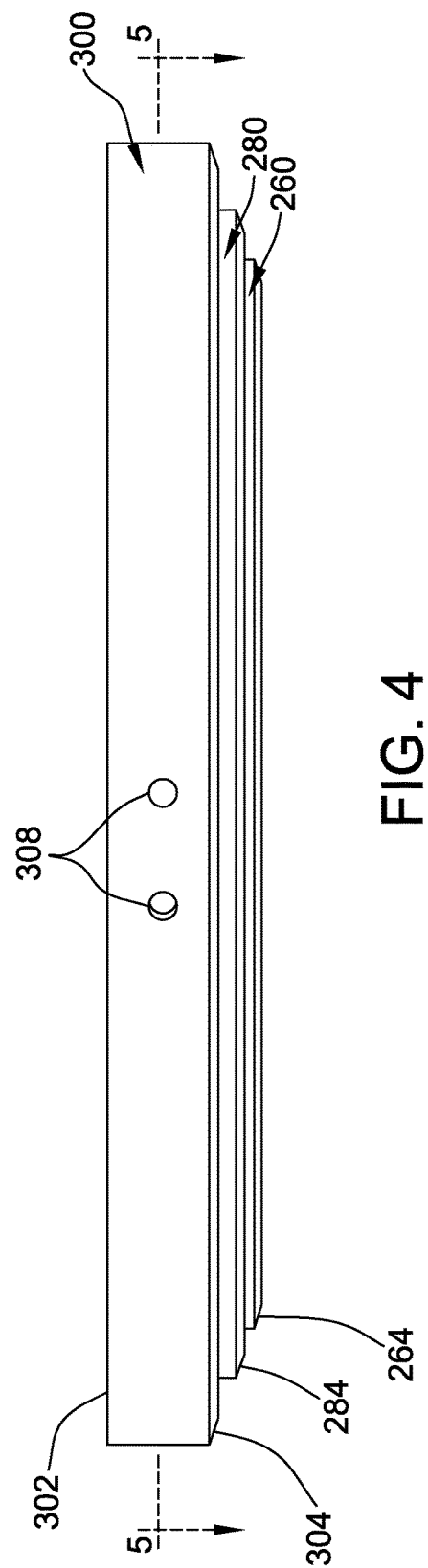
FIG. 4 is a side elevation of the plurality of weirs of FIG. 3 in an assembled configuration.
Figure 5:
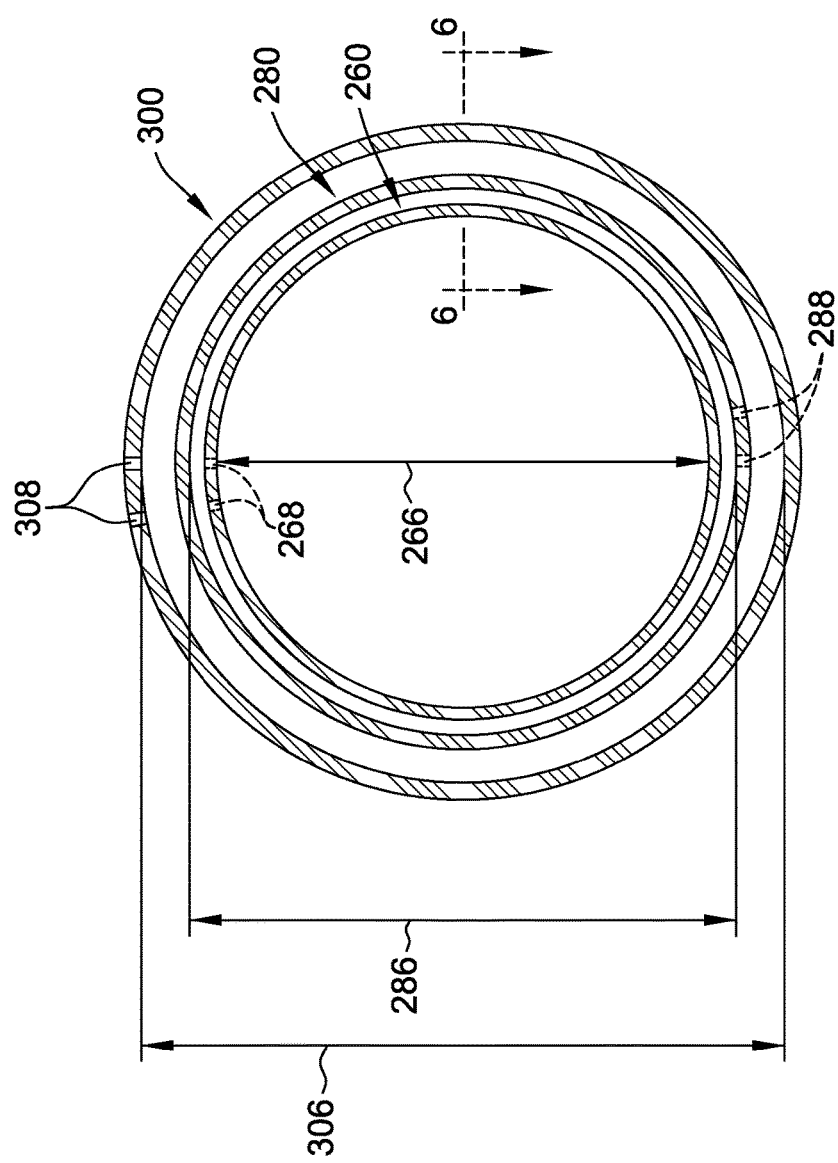
FIG. 5 is a cross-section of the plurality of weirs of FIGS. 3-5 taken along line 5-5 of FIG. 4.
Figure 6:
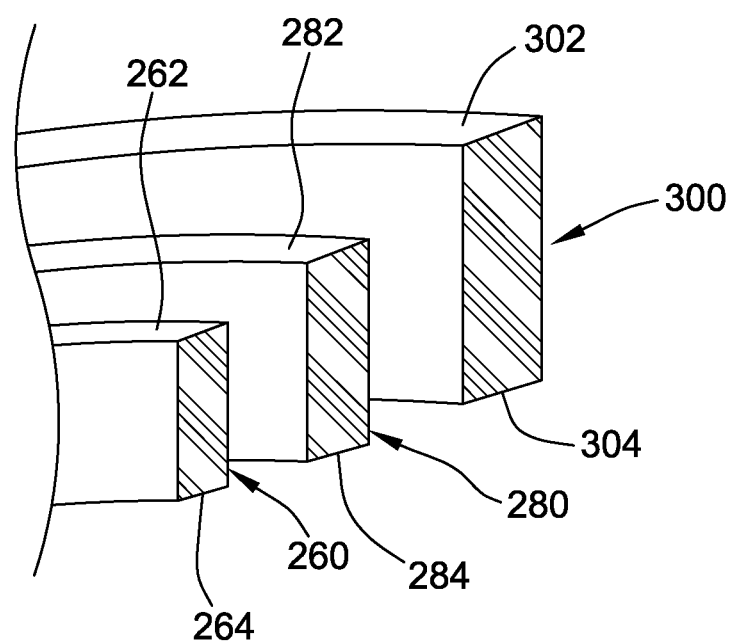
FIG. 6 is a partial cross-section of the plurality of weirs of FIGS. 3-5 taken along line 6-6 of FIG. 5.

With additional reference to FIG. 2, the crucible assembly 200 includes a first crucible 210 having a first base 212 and a first sidewall 214, a second crucible 230 having a second base 232 and a second sidewall 234, and a plurality of concentrically arranged weirs 260, 280, 300.

The first base 212 has a top surface 218 and the second base 232 has a bottom surface 238 and a top surface 240. Each sidewall 214, 234 extends around the circumference of the respective base 212, 232, and defines a diameter 220, 242 of the respective crucible 210, 230. The first sidewall 214 and the first base 212 form an outer cavity 216. The second sidewall 234 and the second base 232 form an inner cavity 236. The second crucible 230 is sized and shaped to allow placement of the second crucible 230 within the outer cavity 216 of the first crucible 210. In some embodiments, the first crucible may have an internal diameter of about 32 inches and the second crucible may have an internal diameter of about 24 inches. In other embodiments, the first crucible may have an internal diameter of about 24 inches and the second crucible may have an internal diameter of about 16 inches. In yet other embodiments, the first and second crucibles may have any suitable internal diameter that enables the crucible assembly 200 to function as described herein.

With additional reference to FIGS. 3-6, the plurality of concentrically arranged weirs includes a first weir 260, a second weir 280, and a third weir 300. While the illustrated embodiment is shown and described as including three weirs, the system 100 may include more or fewer than three weirs, such as one weir, two weirs, or any other suitable number of weirs that enables the system 100 to function as described herein.

The weirs 260, 280, 300 each have a cylindrical body with an open top and bottom. Each weir 260, 280, 300 also has a top weir surface 262, 282, 302 and a bottom weir surface 264, 284, 304, respectively.

The weirs 260, 280, 300 support the second crucible 230 within the outer cavity 216. More specifically, the bottom weir surfaces 264, 284, 304 rest against the top surface 218 of first base 212, and the bottom surface 238 of the second base 232 rests against the top weir surfaces 262, 282, 302. In the illustrated embodiment, each bottom weir surface 264, 284, 304 is shaped to conform to a respective contact point of the first crucible 210. Similarly, each top weir surface 262, 282, 302 is shaped to conform to a respective contact point of the second crucible 230. In alternative embodiments, one or more of the top and bottom weir surfaces may have a shape other than a shape that conforms to a respective contact point of the first or second crucible.

Each weir 260, 280, 300 has a respective diameter 266, 286, 306 (FIG. 5) defined by the cylindrical body of the weir. In the illustrated embodiment, the diameter 306 of the third weir 300 is greater than the diameter 286 of the second weir 280, and the diameter 286 of the second weir 280 is greater than the diameter 266 of the first weir 260. The weirs 260, 280, 300 are concentrically aligned with one another such that the third weir 300 is positioned radially outward from the second weir 280, and the second weir 280 is positioned radially outward from the first weir 260.

In some embodiments, one or more of the weirs 260, 280, 300 are bonded to the first base 212. In other embodiments, one or more the weirs 260, 280, 300 are bonded to the second base 232, while in others, one or more of the weirs 260, 280, 300 are bonded to both the first and second bases 212, 232. The first crucible 210 and the second crucible 230 may be fire polished to improve the bond, e.g., the durability and reliability of the bond.

The weirs 260, 280, 300 and the second crucible 230 are arranged within the outer cavity 216 to separate the melt 112 into a plurality of melt zones. More specifically, the second crucible 230 and the weirs 260, 280, 300 separate the melt 112 into an outer melt zone 170 and an inner melt zone 172 (FIG. 1). In the illustrated embodiment, the outer melt zone 170 is formed between the first sidewall 214 and the second sidewall 234, and the inner melt zone 172 is formed within the inner cavity 236 of the second crucible 230.

Each weir 260, 280, 300 is disposed between the first crucible 210 and the second crucible 230, and is located along the first base 212 at a location inward from the first sidewall 214 to inhibit movement of the melt 112 from the outer melt zone 170 to the inner melt zone 172. In the illustrated embodiment, the weirs 260, 280, 300 are arranged to further separate the melt 112 into a first intermediate melt zone 174 (FIG. 1), formed between the third weir 300 and the second weir 280, and a second intermediate melt zone 176 (FIG. 1), formed between the second weir 280 and the first weir 260.

Each weir 260, 280, 300 includes at least one weir passageway 268, 288, 308, respectively, extending therethrough to permit the melt to flow between the outer melt zone 170 and the inner melt zone 172. The weir passageways 268, 288, 308 may be positioned along the respective weir 260, 280, 300 to increase the path of travel for the melt 112 between the outer melt zone 170 and the inner melt zone 172. In the illustrated embodiment, the weir passageways of adjacent weirs are diametrically opposed from one another to provide a circuitous path for the melt 112 between the outer melt zone 170 and the inner melt zone 172, although in other embodiments the weir passageways may be positioned at any suitable location along the respective weir. In the illustrated embodiment, each weir 260, 280, 300 includes two weir passageways 268, 288, 308, although the weirs may include more or fewer than two weir passageways, such as one passageway, three passageways, or any other suitable number of passageways that enables the system 100 to function as described herein.

In other embodiments, one or more weirs do not include passageways. In these embodiments, movement of the melt 112 from the outer melt zone 170 to the inner melt zone 172 is limited to movement above or below the weirs.

With further reference to FIG. 1, the feed system 115 includes a feeder 118 and a feed tube 120. Solid feedstock material 116 may be placed into the outer melt zone 170 from feeder 118 through feed tube 120. The amount of feedstock material 116 added to the melt 112 may be controlled by a controller 122 based on a temperature reduction in the melt resulting from the cooler feedstock material 116 being added to melt 112.

As solid feedstock material 116 is added to melt 112, the surface of the melt may be disturbed where the solid feedstock material 116 is introduced. This disturbance, if allowed to propagate through the melt 112, also affects the ability of the silicon atoms of the melt 112 to properly align with the silicon atoms of the seed crystal 132. The weirs 260, 280, 300 and the second sidewall 234 of the second crucible 230 inhibit inward propagation of the disturbances in the melt 112.

The heat reflector 160 is positioned adjacent the crucible assembly 200, and covers a portion of the inner cavity 236 and all of the outer cavity 216. The heat reflector 160 inhibits line-of-sight polysilicon projectiles from reaching the inner melt zone 172 during the addition of the solid feedstock material 116, and prevents gas from the outer melt zone 170 from entering the inner melt zone 172. The heat reflector 160 also shields the ingot 114 from radiant heat from the melt 112 to allow the ingot 114 to solidify.

The heat system 123 provides heat to crucible assembly 200 by heaters 124, 126, and 128 arranged at suitable positions about the crucible assembly 200. Heat from heaters 124, 126, and 128 initially melt the solid feedstock material 116 and then maintains melt 112 in a liquefied state. Heater 124 is generally cylindrical in shape and provides heat to the sides of the crucible assembly 200, and heaters 126 and 128 provide heat to the bottom of the crucible assembly. In some embodiments, heaters 126 and 128 are generally annular in shape, and are positioned around and radially outward from the shaft 152.

Heaters 124, 126, and 128 are resistive heaters coupled to controller 122, which controllably applies electric current to the heaters to alter their temperature. A sensor 130, such as a pyrometer or like temperature sensor, provides a continuous measurement of the temperature of melt 112 at the crystal/melt interface of the growing single crystal ingot 114. Sensor 130 also may be directed to measure the temperature of the growing ingot. Sensor 130 is communicatively coupled with controller 122. Additional temperature sensors may be used to measure and provide temperature feedback to the controller with respect to points that are critical to the growing ingot. While a single communication lead is shown for clarity, one or more temperature sensor(s) may be linked to the controller by multiple leads or a wireless connection, such as by an infra-red data link or another suitable means.

The amount of current supplied to each of the heaters 124, 126, and 128 by controller 122 may be separately and independently selected to optimize the thermal characteristics of melt 112. In some embodiments, one or more heaters may be disposed around the crucible to provide heat.

As described above, the weirs and the second crucible separate the melt into multiple melt zones. Separating the melt into multiple melt zones and inhibiting the melt movement between the various zones facilitates heating and melting silicon material (e.g., silicon feedstock) added in the outer melt zone as the silicon material passes through the multiple zones to the inner melt zone, and thus prevents un-liquefied feedstock material from passing into the inner melt zone and disturbing the structural integrity of the ingot being formed therefrom.

Further, inhibiting movement of the melt between the zones allows the surface of the inner zone to remain relatively undisturbed. The weirs and the second crucible substantially prevent disturbances in the outer melt zone or intermediate melt zones from disrupting the surface of the melt in the inner melt zone by substantially containing the energy waves produced by the disturbances in the outer melt zone and intermediate melt zones.

The transfer of heat to the inner melt zone may, however, be adversely affected by the addition of too many weirs. For example, quartz weirs can act as a thermal barrier to heat provided by heaters 124, 126, 128, which may prevent a sufficient amount of heat from being transferred to the inner melt zone 172 to maintain the liquid melt 112. The second crucible 230 is therefore configured to facilitate the transfer of heat to the inner melt zone 172.

Figure 7:
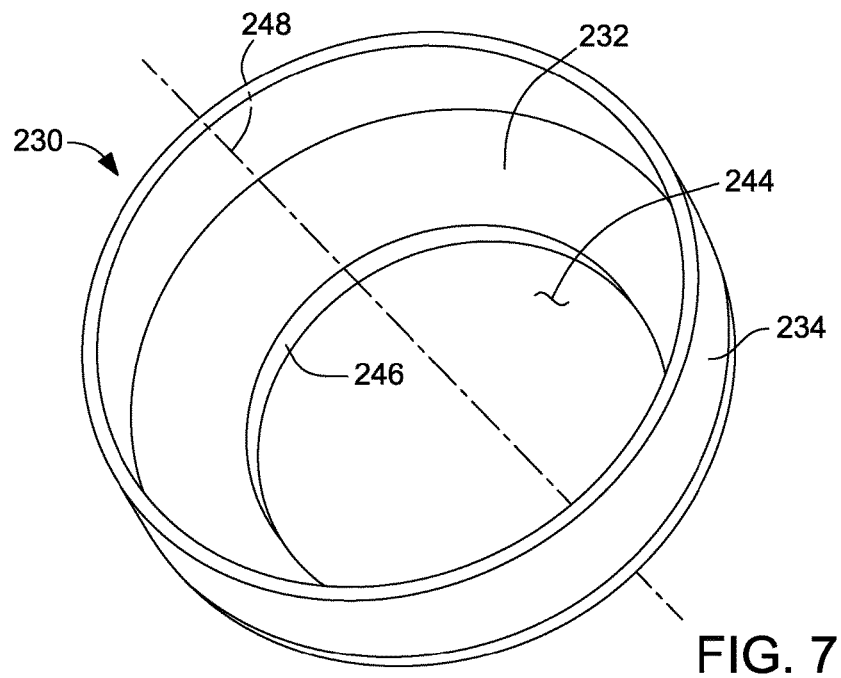
FIG. 7 is a top perspective of a second crucible used in the crucible assembly of FIG. 2.
Figure 8:
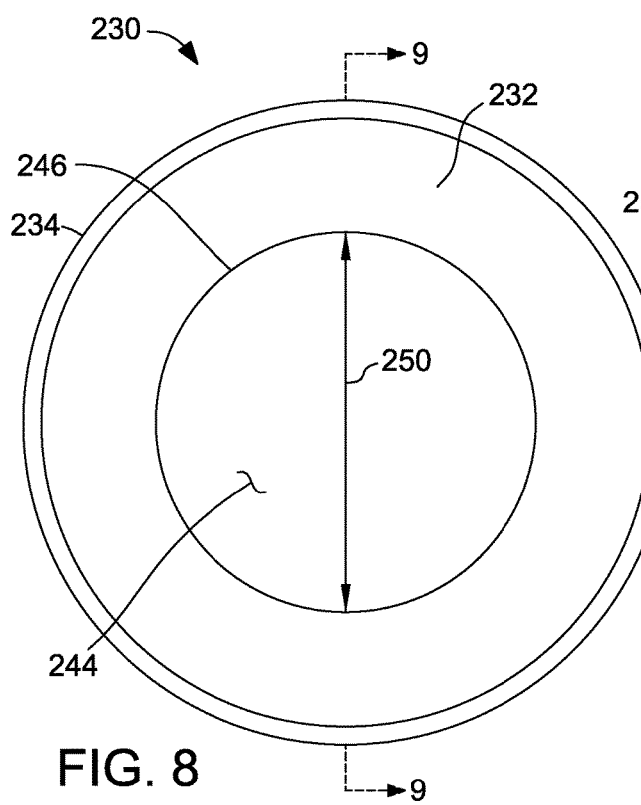
FIG. 8 is a top elevation of the second crucible of FIG. 7.
Figure 9:
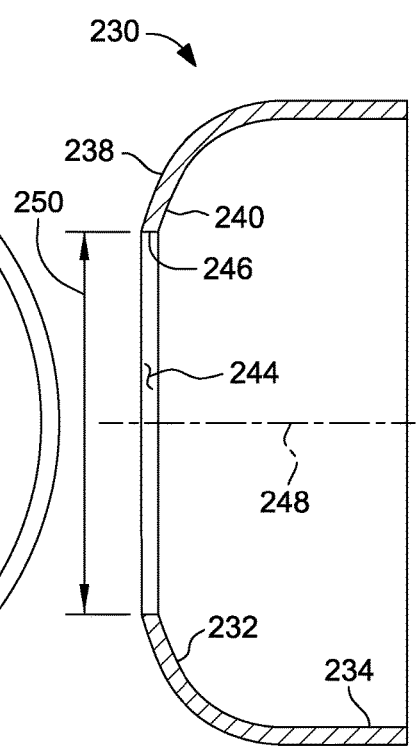
FIG. 9 is a cross-section of the second crucible of FIGS. 7-8 taken along line 9-9 of FIG. 8.

More specifically, with additional reference to FIGS. 7-9, the second base 232 of the second crucible 230 has an opening 244 defined by an annular rim 246 extending from the top surface 240 of the second base 232 to the bottom surface 238 of the second base 232. While the illustrated embodiment is shown and described as including one opening, alternative embodiments may have more than one opening formed in the second crucible 230.

The rim 246 is substantially parallel to the second sidewall 234 of the second crucible, although the rim 246 may be tapered inward or outward with respect to a central longitudinal axis 248 of the second crucible 230.

The opening 244 extends through the second crucible 230, and is sized and shaped to facilitate the transfer of heat from the outer cavity 216 to the inner cavity 236. More specifically, the opening is sized based on the size of the first weir 260. In one suitable embodiment, for example, the opening has a diameter 250 that is sized based on the diameter 266 of the first weir 260. More specifically, the ratio between the diameter 250 of the opening 244 and the diameter 266 of the first weir 260 is at least about 0.5, more suitably at least about 0.7, and, even more suitably, at least about 0.95. In the illustrated embodiment, for example, the ratio between the diameter 250 of the opening 244 and the diameter 266 of the first weir 260 is about 1.0.

In another suitable embodiment, the opening 244 is sized based on a cross-sectional area enclosed by the first weir 260 taken perpendicular to the central longitudinal axis 248 of the second crucible 230. In one suitable embodiment, for example, the ratio between the cross-sectional area of the opening 244 and the cross-sectional area of the first weir 260 is at least about 0.25, more suitably at least about 0.5, and even more suitably, at least about 0.8. In the illustrated embodiment, for example, the ratio between the cross-sectional area of the opening 244 and the cross-sectional area of the first weir 260 is about 1.0.

In the illustrated embodiment, the opening 244 has a substantially circular shape, although in other embodiments, the opening may have any suitable shape that enables the system 100 to function as described herein.

The opening 244 is positioned radially inward from the innermost weir (i.e., the first weir 260) such that separation between the multiple melt zones is maintained. In the illustrated embodiment, the opening 244 is concentric with the central longitudinal axis 248 of the second crucible 230, although the opening 244 may be offset from the central longitudinal axis 248 of the second crucible 230. Also, in the illustrated embodiment, the opening 244 is sized and positioned such that the rim 246 is substantially aligned with the radially inner wall of the first weir 260.

The opening 244 also provides fluid communication between the outer melt zone 170 and the inner melt zone 172, and allows the melt 112 to flow between the inner cavity 236 and the outer cavity 216.

The opening 244 enables heat to be transferred directly from the first crucible 210 to the inner melt zone 172. Further, the temperature gradient across the melt 112 from the first base 212 of the first crucible 210 to the surface of the melt 112 causes the melt 112 to recirculate within the inner melt zone 172, thereby enhancing the transfer of heat from the first crucible 210 to the melt 112 within the inner melt zone 172.

Figure 10:
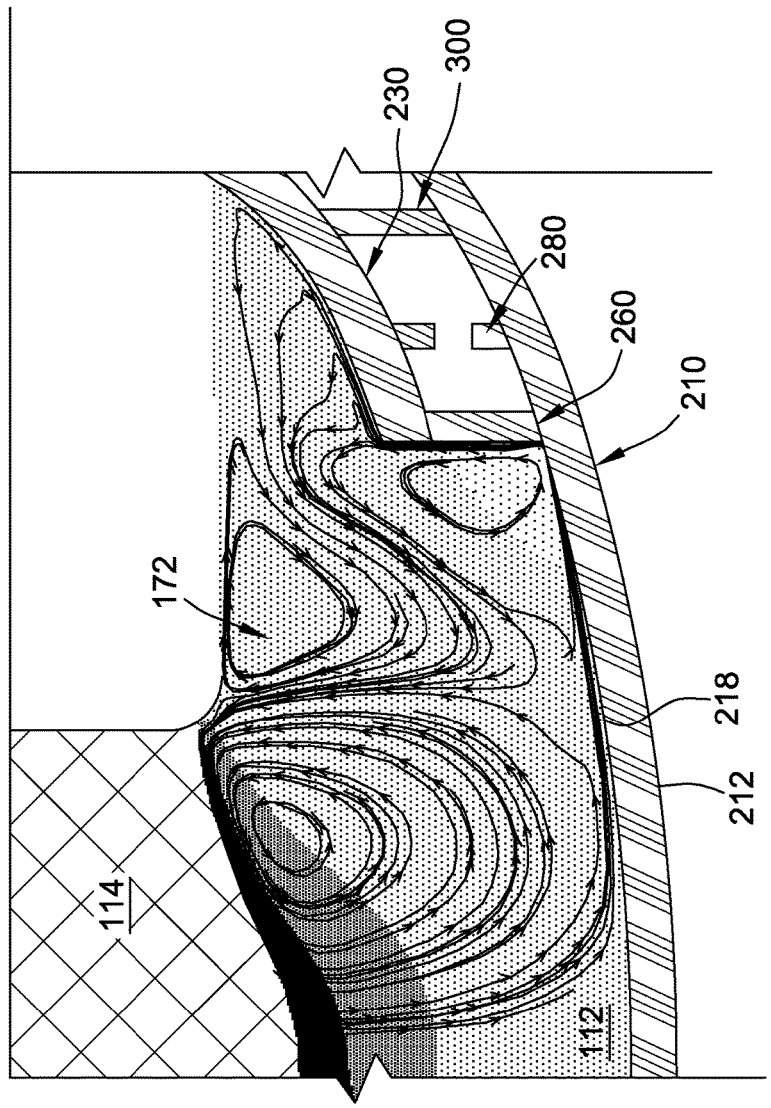
FIG. 10 is a partial cross-section of the crystal growing system of FIG. 1 illustrating the temperature field and streamlines of a melt.

Specifically, referring to FIG. 10, streamlines and temperature fields of the melt 112 are shown within the inner melt zone 172. The melt 112 is hotter near the first base 212 of the first crucible 210 and the first weir 260 than it is near the surface of the melt 112. As a result, the melt 112 recirculates between the hotter and cooler portions, thereby enhancing the transfer of heat from the first crucible 210 to the melt 112 within the inner melt zone 172. Further, recirculation of the melt 112 within the inner melt zone 172 provides a more uniform distribution of impurities within the melt 112 (e.g., by carrying high concentrations of impurities away from the ingot-melt interface), thereby reducing the level of impurity concentrations within the melt 112 and enhancing the quality of the ingot 114 grown from the melt 112.

As described above, the crystal growing systems of the present disclosure provide an improvement over known crystal growing systems. The crystal growing systems of the present disclosure enable separation of a silicon melt into multiple melt zones, while at the same time enhancing heat transfer to an inner melt zone of the melt.

Separating the melt into multiple melt zones and inhibiting the melt movement between the various zones facilitates heating and melting silicon material (e.g., silicon feedstock) added in the outer melt zone as the silicon material passes through the multiple zones to the inner melt zone, and thus prevents un-liquefied feedstock material from passing into the inner melt zone and disturbing the structural integrity of the ingot being formed therefrom. Further, inhibiting movement of the melt between the zones allows the surface of the inner zone to remain relatively undisturbed. The weirs and the second crucible substantially prevent disturbances in the outer melt zones or intermediate melt zones from disrupting the surface of the melt in the inner melt zone by substantially containing the surface vibrations produced by the disturbances in the outer melt zone and intermediate melt zones.

Embodiments of this disclosure may also reduce the amount of oxygen in the ingot, lower the consumption rates of the weir and second crucible providing a longer run life, and provide better system performance, as described in the co-pending '585 application.

Another benefit is that the volume and liquid-quartz surface area of the outer melt zone is increased compared to known crystal growing systems. The increase in volume and liquid-quartz surface area of the outer melt zone enhances heat transfer to the outer melt zone increasing the rate that solid feedstock material is liquefied. The increase in the conversion rate is particularly beneficial when the rate of adding solid feedstock material is high and a large amount of heat is needed to continuously liquefy solid feedstock material.

The above embodiments also provide improved impurity characteristics while reducing incidents of loss of crystal structure due to solid particles impacting the crystal.

Additionally, the above embodiments enhance the transfer of heat to an inner melt zone of the melt. Enhancing the transfer of heat to the inner melt zone substantially prevents the melt from solidifying within the inner melt at locations other than the melt-ingot interface. Additionally, enhancing the transfer of heat to the inner melt zone causes the melt to recirculate within the inner melt zone, thereby further enhancing the transfer of heat to the inner melt zone and providing a more uniform distribution of impurities within the melt.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A system for growing an ingot from a melt, the system comprising:
    an outer crucible including a first sidewall and a first base, the first sidewall and the first base defining an outer cavity for containing the melt;
    an inner crucible located within the outer cavity, the inner crucible having a central longitudinal axis, the inner crucible including a second sidewall and a second base extending radially inward from the second sidewall and having an opening therein, the second base having a top side and a bottom side opposite the top side, the opening in the second base concentric with the central longitudinal axis; and
    a first, annular weir disposed between the outer crucible and the inner crucible to inhibit movement of the melt from a location outward of the weir to a location inward of the weir, the first weir supporting the inner crucible along the bottom side, the first weir contacting the bottom side continuously around a circumference of the first weir, the first weir being inward of the second sidewall of the inner crucible.

2. The system of claim 1, wherein the opening has a first diameter, the first weir has a second diameter, the second sidewall has a third diameter, the third diameter is greater than the second diameter, and the ratio between the first diameter and the second diameter is at least about 0.5.

3. The system of claim 1, wherein the opening is defined by an annular rim, the rim being substantially aligned with the first weir, the rim being tapered with respect to the central longitudinal axis.

4. The system of claim 1, wherein the first weir has a plurality of first weir passageways extending therethrough to permit the melt to flow between an outer melt zone and an inner melt zone.

5. The system of claim 4, further comprising a second, annular weir positioned radially outward from the first weir and supporting the inner crucible along the second base, the second weir having a plurality of second weir passageways extending therethrough.

6. The system of claim 5, wherein the first weir passageways and the second weir passageways are diametrically opposed from one another to provide a circuitous path for the melt.

7. The system of claim 1, further comprising a shaft for supporting the inner and outer crucibles, and a heater disposed radially outward from the shaft.

8. The system of claim 1, further comprising a heater disposed below the first base of the outer crucible and radially inward from the first sidewall of the outer crucible.

9. A system for growing an ingot from a melt, the system comprising:
- an outer crucible including a first sidewall and a first base, the first sidewall and the first base defining an outer cavity for containing the melt;
- an inner crucible located within the outer cavity, the inner crucible including a second sidewall and a second base extending radially inward from the second sidewall and having an opening therein, the opening having a first cross-sectional area;
- a first, annular weir disposed between the outer crucible and the inner crucible for supporting the inner crucible and to inhibit movement of the melt from a location outward of the weir to a location inward of the weir, the first weir being inward of the second sidewall of the inner crucible, the first weir having a second cross-sectional area, wherein a ratio between the first cross-sectional area and the second cross-sectional is at least about 0.25, the first weir and the inner crucible define an inner melt zone, the first weir, the inner crucible, and the outer crucible define an outer melt zone; and
- a heat reflector disposed on top of the inner and outer crucibles, the heat reflector contacting the top of the inner and outer crucibles and being configured to prevent a flow of gas from the outer melt zone from entering the inner melt zone.

10. The system of claim 9, wherein the second sidewall and the second base define an inner cavity, the opening in the second base sized to facilitate heat transfer from the outer cavity to the inner cavity.

11. The system of claim 9, wherein the opening has a first diameter, the first weir has a second diameter, and the ratio between the first diameter and the second diameter is at least about 0.5.

12. The system of claim 9, wherein the first weir has a first weir passageway extending therethrough to permit the melt to flow between the outer melt zone and the inner melt zone.

13. The system of claim 12, further comprising a second, annular weir positioned radially outward from the first weir, the second weir having a second weir passageway extending therethrough.

14. The system of claim 13, wherein the first weir passageway and the second weir passageway are diametrically opposed from one another to provide a circuitous path for the melt.

15. The system of claim 9, further comprising a shaft for supporting the inner and outer crucibles, and a heater disposed radially outward from the shaft.

16. A system for growing an ingot from a melt, the system comprising:
- an outer crucible including a first sidewall and a first base, the first sidewall and the first base defining an outer cavity for containing the melt;
- an inner crucible located within the outer cavity, the inner crucible including a second sidewall and a second base extending radially inward from the second sidewall and having an opening therein, the second sidewall and the second base defining an inner cavity, the second sidewall having a third diameter, the opening sized to facilitate the transfer of heat between the outer cavity and the inner cavity, the opening having a first diameter;
- a first, annular weir disposed between the outer crucible and the inner crucible to inhibit movement of the melt from a location outward of the weir to a location inward of the weir, the first weir having a second diameter less than the third diameter, the first weir being bonded to the second base; and
- a second, annular weir positioned radially outward from the first weir for separating the melt into multiple melt zones, the first and second weirs supporting the inner crucible along the second base, the second weir not bonded to the second base.

17. The system of claim 16, wherein the inner crucible has a central longitudinal axis, and the opening in the second base is concentric with the central longitudinal axis.

18. The system of claim 16, wherein the ratio between the first diameter and the second diameter is at least about 0.5.

19. The system of claim 16, wherein at least one of the first weir and the second weir has a first weir passageway extending therethrough to permit the melt to flow between an outer melt zone and an inner melt zone.

20. The system of claim 16, wherein the first weir has at least one first weir passageway extending therethrough, the second weir has at least one second weir passageway extending therethrough, and the first weir passageway and the second weir passageway are diametrically opposed from one another.

* * * * *